United States Patent
Dietz et al.

(10) Patent No.: US 6,441,755 B1
(45) Date of Patent: Aug. 27, 2002

(54) DEVICE AND METHOD FOR ENTROPY ENCODING OF INFORMATION WORDS AND DEVICE AND METHOD FOR DECODING ENTROPY-ENCODED INFORMATION WORDS

(75) Inventors: Martin Dietz, Nuernberg; Ali Nowbakht-Irani; Ralph Sperschneider, both of Erlangen; Oliver Kunz, Sesslach, all of (DE)

(73) Assignee: Fraunhofer-Gesellschaft zur Foerderung der angewandten Forschung e.V. (DE)

( * ) Notice: Subject to any disclaimer, the term of this patent is extended or adjusted under 35 U.S.C. 154(b) by 0 days.

(21) Appl. No.: 09/786,614

(22) PCT Filed: Aug. 12, 1999

(86) PCT No.: PCT/EP99/05859

§ 371 (c)(1),
(2), (4) Date: May 7, 2001

(87) PCT Pub. No.: WO00/14886

PCT Pub. Date: Mar. 16, 2000

(30) Foreign Application Priority Data

Sep. 7, 1998 (DE) .......................... 198 40 835

(51) Int. Cl.$^7$ .......................... H03M 7/00; H03M 7/40
(52) U.S. Cl. ................................ 341/50; 341/67
(58) Field of Search .................. 341/50, 67, 65; 714/746, 822

(56) References Cited

U.S. PATENT DOCUMENTS

| | | | |
|---|---|---|---|
| 3,918,027 A | 11/1975 | Lechner | 714/822 |
| 5,488,516 A * | 1/1996 | Takishima et al. | 371/30 |
| 5,488,616 A | 1/1996 | Takishima et al. | 714/746 |
| 5,581,653 A | 12/1996 | Todd | 704/229 |
| 5,852,469 A | 12/1998 | Nagai et al. | 348/384 |
| 6,084,536 A * | 7/2000 | Arts | 341/58 |

FOREIGN PATENT DOCUMENTS

| | | | | |
|---|---|---|---|---|
| EP | 0 732 855 A2 | 9/1996 | | H04N/17/50 |
| JP | 0050300027 AA | 11/1993 | | H04N/7/50 |

OTHER PUBLICATIONS

Beraud et al., "Block Companded Differential Coding Of A–Law Coded Signals," IBM Technical Disclosure Bulletin, IBM Corp., vol. 23 (No. 3), pp. 1067–1069 (Aug., 1980).
Fraenkel et al., "Bidirectional Huffman Coding," The Computer Journal, vol. 33 (No. 4), pp. 296–307 (1990).
Bang et al., "A tool for generating bit error resilient VLC tables," International Organisation For Standardisation—Coding Of Moving Pictures And Associated Audio Information, MPEG 96/0902, pp. 1–8 (Jul., 1996).

\* cited by examiner

*Primary Examiner*—Peguy JeanPierre
(74) *Attorney, Agent, or Firm*—Patton Boggs LLP

(57) ABSTRACT

A method and a device for entropy encoding and associated decoding make use of a code consisting on the one hand of a code table with reversible code words (12) and comprising on the other hand an escape region for information words to be coded which are located outside the region (14) defined by said code table. Said region can be selected in such a way that a major part of the information words is coded with symmetrical code words by the code table. On the one hand, it is thus possible to carry out, in addition to forward decoding, also backward decoding (24) and on the other hand, use of reversible code words allows for rapid recognition of errors in a code word stream transmitted over a non-ideal channel.

20 Claims, 3 Drawing Sheets

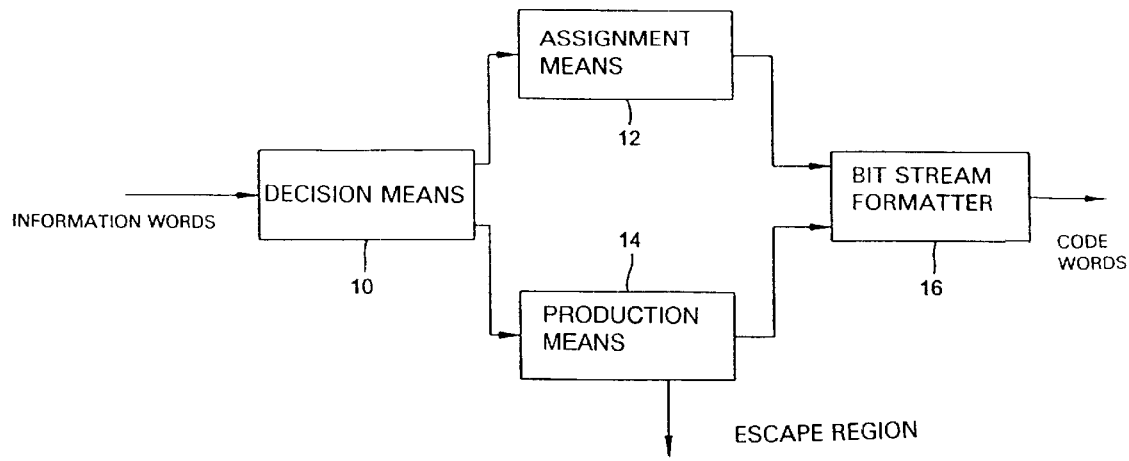
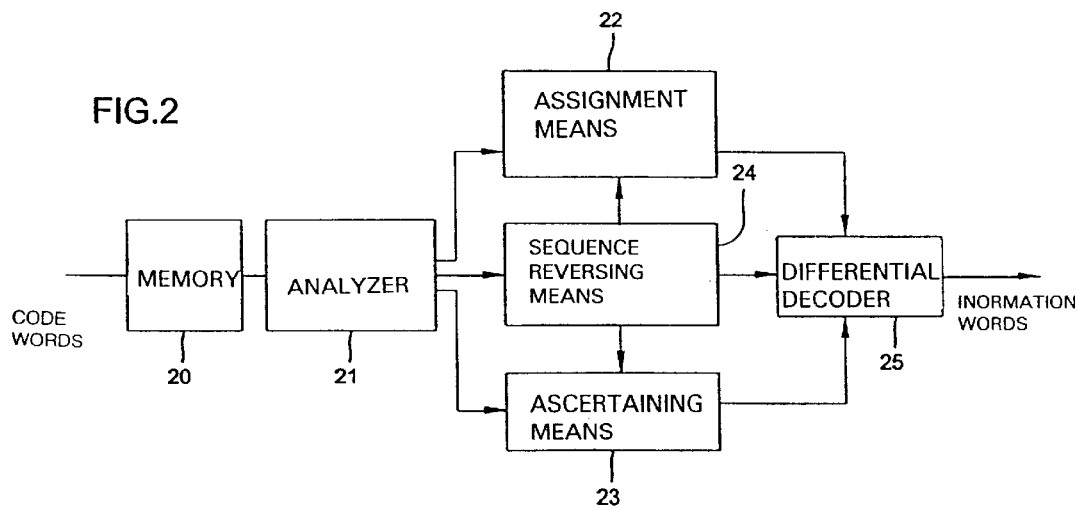
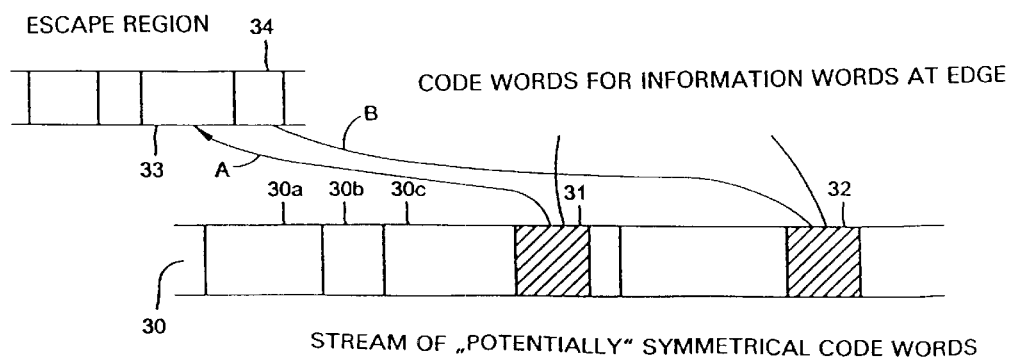

DEVICE AND METHOD FOR ENTROPY ENCODING OF INFORMATION WORDS AND DEVICE AND METHOD FOR DECODING ENTROPY-ENCODED INFORMATION WORDS

The present invention relates to a conception for entropy encoding and to a corresponding conception for decoding entropy-encoded information words. In particular, the present invention relates to error-safe entropy encoding and corresponding decoding of audio signals.

Modern audio coding and decoding methods, respectively, operating for example according to the standard MPEG layer 3, are capable of compressing the data rate of audio signals e.g. by a factor of 12, without notably deteriorating the quality thereof. For obtaining such high data reduction, an audio signal is sampled, thereby obtaining a sequence of time-discrete sampling values. As is known in technology, this sequence of time-discrete sampling values is windowed by means of suitable window functions, so as to obtain windowed blocks of time sampled values. A block of time windowed sampling values then is transformed to the frequency domain by means of a filter bank, a modified discrete cosine transform (MDCT) or another suitable means, for obtaining spectral values which in total represent the audio signal, i.e. the time window established by the block of time-discrete sampling values, in the frequency domain. Usually, time blocks with an overlap of 50% are produced and transformed to the frequency domain by means of a MDCT so that, due to the specific properties of the MDCT, for example 1024 time-discrete sampling values always result in 1024 spectral values.

It is known that the receptivity of the human ear is dependent on the instantaneous spectrum of the audio signal itself. This dependency is noted in the so-called psychoacoustic model, by means of which it has been possible for quite some time to calculate masking thresholds in accordance with the instantaneous spectrum. Masking means that a specific sound or spectral component is concealed, for example, if an adjacent spectral region is of relatively high energy. This fact of masking is exploited for quantizing the spectral values present after the transform as roughly as possible. Therefore, endeavors are being made to avoid audible disturbances in the again decoded audio signal on the one hand and to utilize as few bits as possible for coding, or in the instant case quantizing, the audio signal on the other hand. The disturbances introduced by quantization, i.e. the quantization noise, should be below the masking threshold and thus should be inaudible. In accordance with known methods, a classification of the spectral values to so-called scale factor bands is carried out, which are supposed to correspond to the frequency groups of the human ear. Spectral values within a spectral value group are multiplied by a scale factor in order to scale spectral values of a scale factor band in total. The scale factor bands scaled by the scale factor then are quantized, whereupon quantized spectral values are formed. Of course, grouping into scale factor bands is not decisive. However, it is employed in the standard MPEG layer 3 and the standard MPEG-2 AAC (AAC=Advanced Audio Coding).

A very essential aspect of data reduction consists in entropy encoding of the quantized spectral values, which takes places after quantizing. For entropy encoding, Huffman coding is usually employed. Huffman coding is understood to be a variable length coding, i.e. the length of the code word for a value to be coded is dependent on the occurrence probability thereof. The most probable symbol logically has the shortest code, i.e. the shortest code employed is an unsymmetrical fixed length code, into which a symmetrical variable length code is mixed such that a specific number of bits of a fixed length code word is followed by a bit of a symmetrical variable length code word. The symmetrical variable length code words merely serve to provide for error robustness and do not carry useful information. On the receiver side, the symmetrical variable length code words are first extracted and analyzed with respect to transmission errors.

What is disadvantageous with respect to this mixed code is the fact that it is not possible to ascertain errors occurring in the fixed length code words, as only the symmetrical variable length code words are examined. On the other hand, disturbance-free fixed length code words can be identified as being error-inflicted if the associated variable length code words contain disturbances.

U.S. Pat. No. 5,488,616 is concerned with a system for providing reversible variable length codes. To this end, an asymmetrical reversible code is produced from a non-reversible variable length code, which is produced in provisional manner only. The non-reversible variable length code furthermore is converted to a symmetrical reversible code. A selection means selects either the asymmetrical reversible code or the symmetrical reversible code as output signal. The symmetrical reversible code is represented by a complete code tree in which all branches are concluded either by symmetrical code words or by branching points, with these branching points in turn being concluded by a symmetrical code word or leading to further branching points. The code tree contains exclusively symmetrical code words.

EP 0 732 855 A2 discloses a system of coding and/or decoding video images using variable length code words. The coder comprises a first coder having a code word table for source symbols in a region of source symbols, with this code table containing variable length code words assigned to source symbols. The source symbols that can be coded by variable length code words of the first code table have a relatively high probability of occurrence. A source symbol for which there is no code word from the first code table is input to a second coder having a code table with fixed length code words, in order to assign a fixed length code word to the source symbol. In addition thereto, an escape code is placed upstream and downstream of the fixed length code word, with said escape code being taken from the code table of the first coder having variable length code words. The variable length code words of the first coder are reversible code words, whereas the code words of the second coder are of fixed length. This produces a single data stream consisting of reversible variable length code words and of escape codes, with a fixed length code word being arranged between two escape codes each. This data stream can be decoded both in forward and in backward direction, with a decoder, upon coming across an escape code, recognizing the group of bits following the escape code, as a fixed length cod e word, since the decoder has information on the number of bits in the group, i.e. on the length of the fixed length code words.

It is the object of the present invention to make available a conception for entropy encoding of information words and for decoding entropy-encoded information words which permits improved error recognition in case of transmission of the entropy-encoded information words via an error-inflicted channel while nevertheless providing for an optimum possible coding efficiency.

This object is met by a device for entropy encoding according to claim 1, by a device for decoding according to claim 10, by a method for entropy encoding according to claim 19 and by a method for decoding according to claim 20.

The present invention is based on the finding that only those information words can be transmitted in effectively error-robust manner which are coded by reversible, e.g. symmetrical code words. Only reversible code words permit forward and backward coding of a sequence of code words that is unequivocally associated with a sequence of information words. In contrast to the Huffman code, which has unsymmetrical code words, but is nearly optimum for reasons of data compression, a symmetrical code has higher redundancy. This redundancy can be advantageously utilized for error recognition. However, in order to not sacrifice too much compression gain for obtaining error-safeness, not all information words are coded by means of symmetrical code words according to the present invention, but only those information words that are within a specific region of information words. Information words lying outside the region are not coded by means of the symmetrical code, but can be Huffman-coded according to a preferred embodiment of the present invention. Thus, a compromise is made between error-robustness on the one hand and data compression on the other hand.

Another important aspect for the size of the region of information words coded by symmetrical code words is the fact that a short code, i.e. a small code table, is desirable for error localization. The size of the region implicitly determines the length of the longest code word, since with increasing number of code words in the table the length of the valid code words increases as well.

Error localization, according to the invention, is carried out in that a decoder recognizes invalid, i.e. non-reversible, code words and concludes therefrom that a transmission . . . [ . . . error is present here, as such a code word by definition was not produced in the coder.]

The present invention is based on the finding that only those information words can be transmitted in effectively error-robust manner which are coded by reversible, e.g. symmetrical code words. Only reversible code words permit forward and backward coding of a sequence of code words that is unequivocally associated with a sequence of information words. In contrast to the Huffman code, which has unsymmetrical code words, but is nearly optimum for reasons of data compression, a symmetrical code has higher redundancy. This redundancy can be advantageously utilized for error recognition. However, in order to not sacrifice too much compression gain for obtaining error-safeness, not all information words are coded by means of symmetrical code words according to the present invention, but only those information words that are within a specific region of information words. Information words lying outside the region are not coded by means of the symmetrical code, but can be Huffman-coded according to a preferred embodiment of the present invention. Thus, a compromise is made between error-robustness on the one hand and data compression on the other hand.

Another important aspect for the size of the region of information words coded by symmetrical code words is the fact that a short code, i.e. a small code table, is desirable for error localization. The size of the region implicitly determines the length of the longest code word, since with increasing number of code words in the table the length of the valid code words increases as well.

Error localization, according to the invention, is carried out in that a decoder recognizes invalid, i.e. non-reversible, code words and concludes therefrom that a transmission error is present here, as such a code word by definition was not produced in the coder. The probability that a disturbance leads to an invalid code word, is highest when there is just a small number of code words present. If a very large number of code words exists, the probability of a disturbance resulting in an invalid code word becomes increasingly smaller since the length of the invalid code words becomes increasingly longer as well.

The method according to the invention is advantageous in particular in such cases in which the information words to be coded are substantially within a region, and information words are outside this region with little probability only. The smaller this region, the fewer symmetrical code words are necessary and the better the error detection, which could be increased by the addition of artificial invalid code words. Thus, it is attempted to select the region of the information words coded by symmetrical code words as small as possible in the sense of efficient error localization, but to select it nevertheless so large that the information words are within this region with great probability and are coded symmetrically, in order to provide for an in total sufficient error robustness.

A preferred use of the present invention consists in entropy encoding of scale factors of a transformation-encoded audio signal, since with this use, seen statistically, 98% of the scale factor values occurring are within a graspable region that can be coded by symmetrical code words that are not yet of excessive length. If an information word outside of this region is to be entropy-encoded, an additional value is transmitted which is referred to as "escape". The escape value preferably is Huffman coded and transmitted separately from the symmetrically coded scale factors in the audio bit stream.

The sense of entropy encoding according to the invention thus consists in being able, despite a relatively small RVLC table, to cover a large region of code words with good error recognition properties. The coding efficiency hardly suffers in the preferred application mentioned, since escape-encoded values occur only rarely there.

The application of the present invention to the scale factors of a transformation-encoded audio signal is advantageous in particular as already smaller disturbances in the scale factors due to a non-ideal channel lead to strongly audible disturbances since, as is known, a scale factor weights several spectral lines in multiplicative manner. Since, furthermore, the scale factor, as compared to the coded spectral values, make up a relatively small part of the entire bit quantity only, protection of the scale factors by a redundant code does not result in a considerable additional expenditure of bits. This slight additional expenditure is more than justified by the error-safeness of the scale factors which, as compared to their bit quantity, may introduce by far higher disturbances into an audio signal.

However, the present invention is not restricted to entropy encoding and decoding of scale factors, but is advantageous in all situations where information words are to be coded which are within a region with high probability, such that one can make do with relatively short symmetrical code words without great loss in efficiency, and in which values outside said region can be encoded by escape sequences.

Preferred embodiments of the present invention will be explained in the following with reference to the accompanying drawings in which FIG. 1 shows a schematic block diagram for a coder according to the present invention;

FIG. 2 shows a schematic block diagram for a decoder according to the present invention;

FIG. 3 shows a schematic representation of the stream of code words processed by the decoder shown in FIG. 2;

Figure 4A:
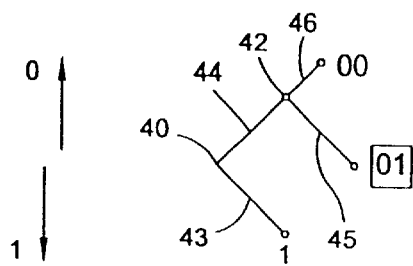
FIGS. 4A to 4C show symmetrical codes according to the prior art.

Before discussing the figures in detail, however, some general aspects of entropy encoding shall be indicated. In particular, the special aspects in coding differentially encoded values shall be discussed, which can be advantageously combined with coding by means of symmetrical code words and escape values.

The code according to the invention represents an entropy code which, similarly to the frequently employed Huffman code, assigns short code words to frequently occurring values and long code words to rarely occurring values. However, the code according to the invention differs from the Huffman code in the following:

The coding employed, in contrast to Huffman coding, permits first of all decoding from both sides (forward and backward). This is also referred to as "reversible variable length coding" (RVLC) in technology. Backward decoding is possible if reversible, e.g. symmetrical code words, are employed, i.e. if a code book or a code table with reversible code words is employed.

In addition thereto, the use of RVL codes permits the effect that the code table, i.e. the quantity of code words available, does not constitute a "complete tree". Thus, there are code symbol sequences yielding no valid code word, i.e. yielding code words that are not symmetrical.

The gaps arising in the tree can be utilized for detecting transmission errors, as they point out that a code word received never has been produced by a transmitter.

Due to the fact that Huffman coding is optimum in terms of information theory, it does not make sense to use a different code when the sole aim consists in maximizing data compression. However, if the aim is an increase in error insensitivity with as little loss in compression efficiency as possible, the Huffman code is not advantageous. By coding with variable length code words, an error can propagate from the disturbed code word to all subsequent code words. A bit error thus distorts the length of a code word, which has the effect that all subsequent code words in a code word sequence cannot be decoded any more as the decoder has no knowledge as to where the corresponding code words begin.

If, instead of a variable length code such as e.g. the Huffman code, a reversible variable length code is employed, an error changing the length of a code word as a rule can be diagnosed very quickly due to the presence of invalid code words. If an invalid code word is revealed, decoding is stopped. This is not possible in Huffman coding since all code words are valid and invalid code words thus do not exist. In addition thereto, the RVLC permits backward coding, whereby improved localization of the error is possible. This shall be illustrated by way of the following example. A code table according to the invention, for example, could read as follows:

| Information word | Code word |
|---|---|
| 3 | 110011 |
| 2 | 11011 |
| 1 | 111 |
| 0 | 0 |
| −1 | 101 |

-continued

| Information word | Code word |
|---|---|
| −2 | 1001 |
| −3 | 10001 |

The region for information words that can be coded by those code table alone by means of symmetrical code words thus is from −2 to +2. Values outside of these limits, i.e. which in their amount are greater than 2, are provided with an escape value in addition to the symmetrical code word for −3 and +3, respectively.

Code words that cannot occur in the code table shown, are the following ones:

10000
11000
110010
11010

As regards a detailed representation of a code according to the invention, reference is made to FIG. 5 and the corresponding discussion further below.

In the following, a sequence of FIGS. 1, −3, 1, 2, −1 is to be considered as a fictive example in the following, which is to be transmitted over an error-inflicted channel:

TABLE 2

| Sequence of information words: | 1, | −3, | 1, | 2, | −1 |
|---|---|---|---|---|---|
| Sequence of code words: | 111 | 10001 | 111 | 11011 | 101 |

Considering the case that an error produced by the channel causes disturbance of the twelfth bit, the following bit sequence results:

Disturbed sequence of code words: 111, 10001, 111, 01011, 101

Forward decoding of five values yields 11, 10001, 111, 0, 101, i.e. 1, −3, 1, 0, −1.

However, backward decoding results in the following sequence:

101, 11010,
i.e. just −1 and an invalid code word. It can be seem from this simple example that by decoding from the rear, i.e. backward decoding, the invalid code word 01011 is recognized very quickly. Furthermore, by stopping of the decoding operation after the invalid code word, the error can be localized and identified very quickly. Thus, backward decoding reports an error in the region of the last bit up to the eighth bit from the rear.

The two decoded sequences of figures read as follows. Printing in bold in the following table means that the values may contain errors:

Forward: 1 −3 1 0 −1
Backward: x x x x −1

The extent to which error localization is possible here is dependent on the type of the error and the error concealing techniques implemented. Known error concealing techniques consist in simple replacement of an erroneous value by its neighboring intact value. On the other hand, if both intact values neighboring an error are known, weighted average values from the left-hand or right-hand edge may be used for artificially replacing, i.e. concealing, the erroneous value. Still other error concealing techniques employ an interpolation using two neighboring values between which an error is present. It is possible just as well to make use of a unilateral prediction from the front or the back in order to replace an erroneous value by a "possibly relatively intact" value.

FIG. 1 shows an entropy encoder according to a preferred embodiment of the invention. Information words to be coded are input in a decision means 10. In the preceding tables, information words consisted of integers only for the sake of simplicity. In an audio encoder, information words to be entropy-encoded, such as e.g. scale factors, will be present in the form of eight-bit-values, for example. The term "information words" thus is supposed to comprise any kind of representation in which information to be coded can be represented.

It is decided in said decision means 10 whether the information word is within a region of information words or outside the region of information words. The region is determined by the code table implemented in the coder. If it is decided in said decision means that an information word to be coded is within the region, said information word is transferred to means 12 for assigning a symmetrical code word from a group of symmetrical code words, i.e. from the code table, such that a symmetrical code word is assigned to the information word. If, however, the decision means 10 decides that the information word is outside the region defined by the code table, this information word is transmitted by decision means 10 to means 14 for producing an additional value, such that the means 14 ascertains the escape value in a preferred embodiment of the present invention. Means 14 on principle has two outputs, i.e. an output for writing the escape value into an escape region of the bit stream, and on the other hand an output connected to a bit stream formatter 16 producing a stream of code words or a sequence of code words that is associated with the sequence of information words fed to the input of decision means 10.

For more detailed explanation of the mode of operation of the means for producing an additional value or escape value, which in FIG. 1 bears reference numeral 14, reference is made to FIG. 3. FIG. 3 shows a continuous stream 30 of "potentially" symmetrical code words, with the term "potentially" being supposed to point out that the stream has already been transmitted over a non-ideal channel, e.g. the radio path, whereby bit disturbances may have occurred. The stream consists of individual symmetrical code words 30a, 30b, 30c, etc. which are all within the region defined by the code table comprising symmetrical code words. The stream of potentially symmetrical code words, however, comprises furthermore symmetrical code words 31, 32 standing for information words at the edge of the region. The code words 30a to 30c are generated by the assignment means 12 and fed into bit stream formatter 16. The code words, existing for information words at the edge of the region, in a preferred embodiment of the present invention are produced by means 14 and fed from there to the bit stream formatter 16 which forms the stream 30 depicted in FIG. 3. The code words 30a to 30c as well as 31 and 32 represent information words from −7 to +7, i.e. information words having symmetrical code words assigned thereto. If the information word to be encoded has a value of +12 for example, the sum of the symmetrical code word 31 and the escape value yields the value +12.

A decoder coming across code word 31 will immediately recognize that this is a code word at the edge of the region, and the decoder, for decoding the information word, will therefore "go" to the escape region by means of link A in order to find out there that an escape value of, in the present example, 5 is present. According to a preferred embodiment of the present invention, the production means 14 thus performs two functions. On the one hand, it delivers the code word for the edge of the region to the stream 30 of symmetrical code words. On the other hand, it forms the difference between the information word to be coded and the code word at the edge of the region, and produces an escape value which represents the difference. The escape value, of course, may be entropy-encoded again by means of the coding method according to the present invention. However, it is preferred for reasons of data compression to encode the escape value by means of the Huffman code. Moreover, it can be seen from FIG. 3 that the escape value is not written into the stream of symmetrical code words, but to a different location in the bit stream.

If the value −12 is to be encoded, the decision means 10 will determine that this value is outside the region defined by the code table with symmetrical code words. The means 14 for producing an additional value, thus, will output the code word for the value −7 to the bit stream formatter 16 on the one hand and on the other hand will write the difference, i.e. 5, into the escape region. The value −12 then results from the combination of the value −7, in FIG. 3 e.g. the code word 32, and the escape value 34 via the link illustrated by arrow B.

A value of +7 in the preferred embodiment of the present invention would be encoded as code word for +7, i.e. as code word 31, and 0 in the escape region, i.e. as escape value 33.

Differently from the embodiment described, it is not cogent that the means 14 for producing an additional value establishes the difference of the information word to be coded and the information word at the edge of the region and on the one hand writes a symmetrical code word into the stream 30 of symmetrical code words and on the other hand writes the difference into the escape region. As an alternative, it is also possible that the entire information word is written into the escape region, and that the stream of symmetrical code words just has a dummy or specific bit combination or the like inserted therein, either by the means 14 or by the bit stream formatter 16, in order to signal to a downstream decoder that it has to switch to the escape region at this location in the bit stream. However, the method shown provides for the advantage that at least that part of the information word that is in the region covered by symmetrical code words, is coded by means of a symmetrical code word, whereby only the difference, which is coded e.g. by means of a Huffman code, is secured or error-resistant to a lesser extent. In contrast thereto, the alternative method would have the advantage that no addition or formation of the difference would have to be carried out, and that the less redundant code is used for an information word outside the region. However, it is disadvantageous that the information word lying outside the region then cannot be backward-encoded. It is however possible to make use of methods known in the prior art or the method according to the invention for protection of the escape region, in order to create safe conditions here as well.

FIG. 2 shows a preferred embodiment of a decoder according to the present invention. A sequence of code words or a stream of "potentially symmetrical code words" 30 is fed into a memory 20 which can be accessed by an analyzer 21 for analyzing a sequence stored in memory 20. The analyzer 21 comprises on the one hand means for detecting a symmetrical code word from the sequence 30 of code words and on the other hand means for detecting a predetermined code in the sequence 30 of code words. If analyzer 21 detects an intact symmetrical code word, it will transmit the same to means 22 for assigning a specific information word to the code word on the basis of a known code table that has to correspond to the code table used in the coder (FIG. 1). However, if analyzer 21 detects a predetermined code which in the present example, is the code word for an edge of the region, it will pass this code word to means 23 for ascertaining an additional information word outside of the region. In the preferred embodiment means 23, upon occurrence of the code word 31 in stream 30, will access the escape region and retrieve the corresponding escape value there and add or, respectively, subtract the same from the information value corresponding to code word 31.

The assignment of a predetermined code, in the embodiment the code word for an information word at the edge, to a code word in the escape region can be effected in different ways. The simplest possibility is the use of a continuous pointer, with both the escape region and the stream 30 being synchronized. This synchronization in the preferred embodiment of the present invention, in which scale factors are entropy-encoded, is established in that there is processed at all times one block or frame of an audio signal. For each block, the escape region and the stream 30 of symmetrical code words are initialised, so that the use of a continuous pointer produces correct results.

The coder according to the invention comprises furthermore means 24 for reversing the decoder sequence that is activated by the analyzer 21. If the analyzer 21 finds an unsymmetrical code word in stream 30, it will activate said means 24 for reversing the sequence, since an unsymmetrical code word cannot occur in stream 30 of potentially symmetrical code words. The assignment means 22 and the ascertaining means 23 then operate in the reverse sequence from the other end of the sequence of code words in order to localize the error by backward decoding, so that only as few as possible values will have to be replaced by error concealing.

In reality, it may happen that an entropy decoder will not immediately recognize an erroneous code word since the disturbance did not result in an invalid code word. Decoding will thus take place beyond the error until the decoder, due to a subsequent error, comes across an invalid code word and then stops coding. The backward decoder then decodes from the other end, possibly also beyond the erroneous code word, and at some time will stop at an invalid code word. A region of overlap has thus been created in which both the entropy forward and the entropy backward decoder delivered output values. The error is thus localized to the overlapping region, and it can be established that the decoded values outside the overlapping region are correct.

If differential coding has been carried out in the coder, the corresponding decoder comprises furthermore a differential decoder 25 which cancels the differential coding produced in the coder. The differential decoder 25, according to the invention, is also activated by the sequence reversing means 24 to carry out backward differential decoding, in order to produce from differential-encoded information words transmitted to means 25 by means 22 and 23, information words that are completely decoded in backward direction as well. It is to be pointed out that the backward differential decoder and the forward differential decoder may be separate means, or that they are implemented by one single means, with an addition being carried out in forward differential decoding whereas a subtraction takes place in backward differential decoding.

The combination of differential coding with the coding method according to the invention is particularly advantageous, since only differential coding with a suitably selected starting value of difference formation, causes the absolute information words to be "shifted", e.g. by a region symmetrical to zero.

However, for permitting differential decoding 25 in backward direction from the other end of a sequence of information words, an additional value must be added at the end of the sequence of information words in the coder, such that the differential decoder knows from where backward differential coding is to be started. If a fixed starting value has been used in differential coding, the additional value can be created by an additional differential value at the end of the sequence of differential-encoded information words, which indicates the difference from the last information word to the fixed or predetermined starting value. The difference, of course, is entropy-encoded as well and preferably is entropy-encoded by means of a symmetrical information word, such that this value is well protected to permit backward decoding. If the first information word of a sequence of information words is used as starting value for differential-encoding in the coder, it is favorable to add the absolute value of the last information word as additional value at the end of the sequence. This last value quite certainly will not be in the region of information words that are coded with symmetrical code words.

As was already mentioned, a preferred application of the present invention consists in coding scale factors that so far were first subjected to differential coding and then to Huffman coding. The prior art makes use of a Huffman table with 121 code words in order to be able to code values in the region from −60 to +60. Due to the fact that the number of scale factors to be coded is very small as compared with the number of spectral values, with 40 being a typical value, relatively "rapid" detection of errors is absolutely necessary, so that the decoder stops after decoding of just a few values, so that a relatively good error localization is rendered possible. This is why a "small" code table is employed, which means that the number of symmetrical RVLC code words should be small.

The smaller the code table or code book, the more likely is an earlier recognition of errors. The region for information words coded symmetrically therefore extends from −7 to +7. For values in the region from 7 to 60, the escape value is transmitted. The same is preferably subjected to Huffman coding. The "escape" table thus consists of 54 entries for values between 0 and 53. Each time the receiver decodes a −7 or +7, it must thus decode the associated escape value and perform an addition and subtraction thereof, respectively.

Seen in terms of statistics, the interval from −7 to +7 covers 98% of the scale factor values occurring, so that escape values do not occur very often. If more frequent escape values should occur or if even more attention is paid to error safety, there may be employed various known methods as well as the method according to the invention to provide also the escape values with higher error robustness.

For explaining the reversible variable length code according to the invention, FIG. 4A will be dealt with first which shows a known symmetrical code disclosed e.g. in the initially mentioned technical publication by Göran Bang and Göran Roth. This code is defined by a code tree having a root 40 and a branching point 42. As there is a binary code involved, the root has two branches 43, 44 applied thereto, with branch 43 connecting the root 40 to an end point defining the valid code word "1". Branch 44 connects the root 40 to branching point 42 having two branches 45, 46 extending therefrom. Branch 46 is connected to an end point defining the second valid code word "00" of this code, whereas branch 45 defines an invalid code word of this code, i.e. "01". Code word "01" is invalid since it is unsymmetrical. As regards the further notation, it is pointed out that invalid code words in FIGS. 4A and 4B as well as in FIG. 5 are surrounded by frames. The code shown in FIG. 4A thus comprises only two valid code words, i.e. "1" and "00" and only one single invalid code word, i.e. "01", which has the same length as the second valid code word "00".

Figure 4B:
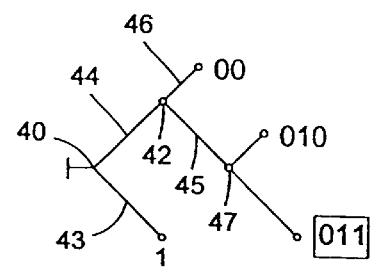

A somewhat longer code is illustrated in FIG. 4B. Contrary to FIG. 4A, the code in FIG. 4B contains an additional valid code word "010" as well as an invalid code word which, like the additional valid code word, also is 3 bits long and has the value "011". Differently from FIG. 4A, branch 45 is not connected to an end point, but to an additional branching point 47 having two branches extending therefrom, with the first branch thereof extending to the additional valid code word "010" and the other branch extending to the sole invalid code word "011".

Figure 4C:
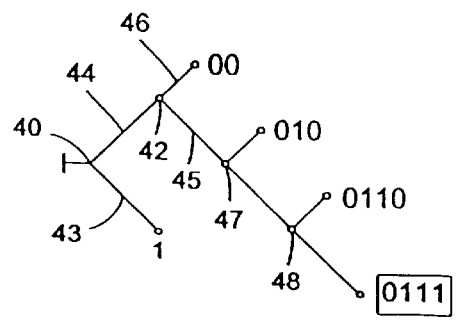

FIG. 4C is the logical continuation of FIGS. 4A and 4B, since the branching point 47 now is connected to an additional branching point 48, from which there are again two branches extending, one branch thereof defining an additional symmetrical code word "0110", whereas the end point of the other branch defines the sole invalid code word "0111" that has the same length (4 bits) as the longest code word of the code tree, i.e. the code table.

FIG. 4C shows in addition that there are no valid code words of the same length. This holds for the codes in FIGS. 4A and 4B as well.

The codes illustrated in FIGS. 4A to 4C, in the technical publication by Göran Bang and Göran Roth, are just utilized as safety patterns and not as codes for coding information, since such a code, as is easily perceivable by logical continuations of the codes shown in the figures, becomes very long with a sufficiently high number of code words. Moreover, the error robust nature of correspondingly longer codes is very low, since there is always only one invalid code word in existence and, moreover, this invalid code word has the same length as the longest valid code word. Coding of information with the known codes thus is not advisable as the code words become very long if an appropriate region of information values is to be coded, and since there is always only one code word existing which in addition thereto is very long. A decoder thus will not recognize an error immediately and commit a large number of subsequent errors before it comes across an invalid code word and stops decoding. The error is therefore localized poorly.

Figure 5:
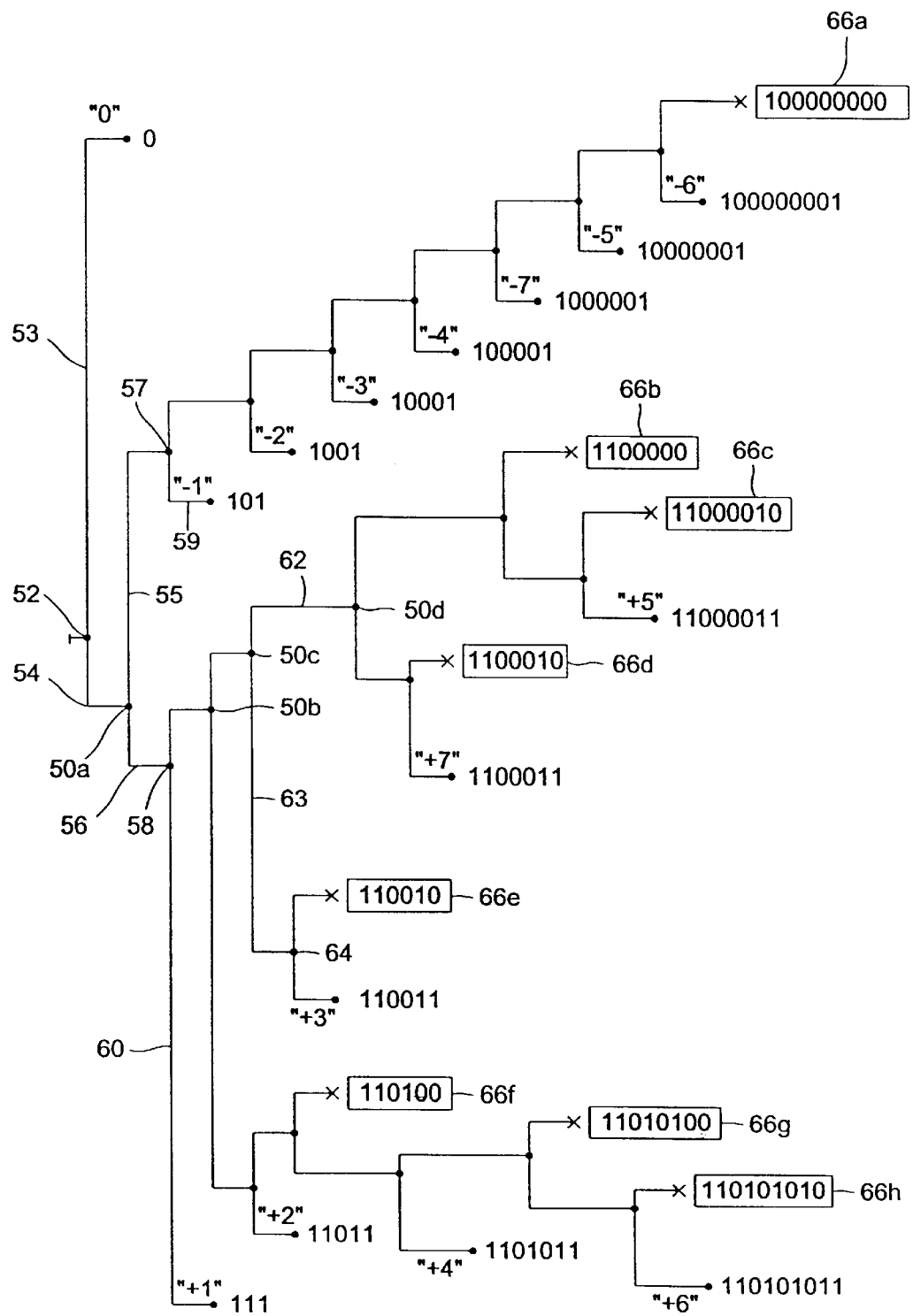
FIG. 5 shows a reversible code according to the present invention.

The code table according to the invention shown in FIG. 5 overcomes these disadvantages in that the code tree has at least one branching point from which two branches emanate that are both connected to a branching point instead of an end point. In the preferred embodiment for the reversible variable length code, as shown in FIG. 5, these are the branching points 50a, 50b, 50c and 50d. The code tree in FIG. 5 comprises furthermore are root 52 from which two branches 53 and 54 extend, branch 53 being connected to an end point which defines the first and shortest code word 0, which in the preferred embodiment has the information value "0" assigned thereto. The code word 0 has the shortest length and, with respect to entropy encoding, thus is associated with the information value occurring most frequently. In the preferred embodiment according to the present invention, in which the information values are differential-encoded, it has turned out that the value 0 occurs with the highest probability in differential coding of scale factors.

The other branch emanating from root 52, i.e. the branch 54, according to the invention does not terminate in a code word with a length of 2 bits, but leads to branching point 50a which in turn is connected, via two branches 55, 56, to additional connecting points 57, 58. The connecting points 57 and 58 in turn are connected via corresponding branches 59, 60, to end points defining the valid code words 101 and 111. In contrast to the prior art, it can be seen here that, by dispensing with a code word with a length of 2 bits, it is possible to obtain two code words of equal length, i.e. 3 bits in FIG. 5. These are code words 101 and 111. In the code table shown in FIG. 5, these are assigned the information values "−1" and "1". It is advantageous under the aspect of entropy encoding to provide also code words of equal length for two information values which very likely occur with the same frequency.

It can be seen from FIG. 5 that connecting point 50c has two branches 62, 63 starting therefrom, branch 63 being connected to a connecting point 64 which via branches is connected to a valid code word 110011 and to an invalid code word 110010. If, for example, a decoder then comes across the invalid code word 110010, it will stop the coding operation as such a code word is not reversible and never has been generated in a coder.

The creation and assignment of additional code words to information values can be seen from FIG. 5. However, reference is to be made to a special aspect. A preferred application of the code according to the invention as shown in FIG. 5 consists in the utilization of the reversible code in conjunction with escape values. As has already been pointed out, an information value outside the region from "−7" to "+7" will be coded by the code word for the corresponding information value at the edge of the region and the difference beyond the same will be coded in an escape table. Thus, there is a higher probability that, in the coded bit stream, the value at the edge of the region, i.e. "−7" and "+7", respectively, has to be coded. Furthermore, the probability is equally high that "−7" or "+7" occurs. According to a preferred embodiment of the present invention, the information values "−7" and "+7" are coded by code words of equal length, i.e. 1000001 and 1100011, respectively, with these code words being at the same time shorter than the longest code words occurring, which in the instant case are the code words for "−6" and "+6", so as to provide a code table that is as good as possible under entropy aspects.

Furthermore, it can be seen from FIG. 5 that there are eight invalid code words 66a to 66h, whereas a reversible code according to the prior art has or can have at all times only one single code word. A large number of invalid code words and in particular relatively short invalid code words, such as e.g. the code words 66e, 66f, provides for high error robustness, such that a decoder stops decoding as fast as possible after an erroneous information value so that an error can be localized within as narrow limits as possible.

Finally, it should be summarized that the reversible variable length code shown in FIG. 5 is suited particularly well for error-robust entropy encoding of information words, since on the one hand there are relatively many short invalid code words in existence and since on the other hand, at the sacrifice of one shorter code word (in the example the code word "11"), there are obtained two code words (in the example 101 and 111) which, though being longer, have the same probability. Although dispensing with a valid short code word actually should be avoided with respect to entropy encoding, this nevertheless provides for a good solution according to the invention in applications in which error-robust entropy encoding is to be carried out and in which occur in addition two information values with relatively high probability and in particular with approximately the same probability. As regards the code table representation in the form of a tree, said dispensing with is achieved by the fact that there are special branching points from which two branches emanate, which however, instead of being connected to an end point, are both connected to additional branching points.

What is claimed is:

1. A device for entropy encoding of information words, comprising:

means for assigning a reversible code word from a group of reversible code words to an information word which is located within a region of information words, the group of reversible code words being designed such that, for each information word within the region, there is provided one specific reversible code word each;

means for producing a predetermined additional code word for an information word which is located outside the region of information words, for producing an additional value for the information word located outside the region of information words, and for assigning a non-reversible variable length code word from a group of non-reversible variable code words to said additional value, with an escape region being produced that is separated from the data stream of reversible code words and consists of non-reversible variable length code words, there being always assigned one code word of the escape region to one of the predetermined code words of the data stream of reversible code words each; and data stream formatting means connected to the means for assigning and to the means for producing and being arranged to produce a data stream of reversible code words comprising only reversible code words for information words within said region and comprising predetermined reversible code words for information words outside said region.

2. A device according to claim 1, wherein the reversible code words are symmetrical code words.

3. A device according to claim 1, wherein the means for producing is arranged such that it produces an additional value also for an information word located on a boundary of said region of information words and such that it produces the predetermined code word for the information word located on the boundary of said region of information words.

4. A device according to claim 1, which is designed such that information words occurring with a probability of occurrence that is above a predetermined limit probability, are located in said region.

5. A device according to claim 1, wherein the means for assigning is arranged such that the size of the region is selected so that the length of the longest code word of the group of reversible code words is smaller than or equal to a predetermined length defined by error recognition aspects.

6. A device according to claim 1, wherein the means for producing is arranged so as to form as additional value the difference between the information word and the information word on a closest boundary of said region.

7. A device according to claim 1, wherein the information words each correspond to numerical values from a first to a second boundary and numerical values outside the boundaries, said first and second boundaries defining said region of information words, wherein the means for assigning is arranged to assign to an information word located on a boundary or outside said region, the predetermined reversible code word, the predetermined reversible code word corresponding to the reversible code word provided according to the code table for the information word corresponding to the boundary of the region which, on the basis of its numerical value, is closest to the numerical value of the information word; and wherein the means for producing produces the difference between the information word to be coded and the information word on the boundary of the region as an additional value, the sign of the difference being determined by the sign of the information word on the boundary of the region, such that the information word to be coded is represented by the predetermined reversible code word for the information word on the boundary of the region and by a sign-free difference as additional value.

8. A device according to claim 1, further comprising:

means for differential encoding of information which, on the basis of a starting value, produces differential-encoded information words, with successive differential-encoded information words representing a differential value sequence.

9. A device according to claim 8, wherein the means for differential encoding further comprises:

means for adding an additional element to the end of the differential value sequence, the additional element being defined such that backward decoding of the differential value sequence can be carried out.

10. A device according to claim 1, wherein the information words are scale factors of a transformation-encoded audio signal.

11. A device for decoding of information words that are entropy-encoded using reversible code words, said information words being present in the form of a data stream and an escape region, the data stream comprising only reversible code words for information words with a region of information words and the escape region comprising non-reversible code words for additional values representing information words outside the region of information words, there being always assigned one code word of the escape region to one predetermined code word of the data stream each, said device comprising:

means for detecting a reversible code word from the data stream;

means for assigning a specific information word to the code word detected from the data stream, on the basis of a code table;

means for detecting a predetermined reversible code word in the data stream;

means for ascertaining outside of said region on the basis of the predetermined code a non-reversible variable length code word in the escape region, which is assigned to the predetermined reversible code word detected from the data stream, for assigning an additional value to the non-reversible variable length code word on the basis of an escape table for the non-reversible variable length code words, and for ascertaining an information word outside of the region of information words on the basis of the additional value.

12. A device according to claim 10, wherein the non-reversible variable length code words are Huffman code words.

13. A device according to claim 10, wherein the means for detecting a reversible code word is arranged such that a non-reversible code word in the first data stream can be ascertained.

14. A device according to claim 12, further comprising:

means for reversing a sequence in which said means for detecting processes the code word sequence, said means for reversing being responsive to a non-reversible code word being ascertained.

15. A device according to claim 13, wherein the sequence of information words, starting from a starting value, is differential-encoded, the sequence furthermore having at the other end thereof an additional value which is selected such that backward differential decoding from the other end can be carried out, said means for differential decoding being arranged to carry out differential decoding from the other end responsive to said means for reversing the sequence.

16. A device according to claim 10, wherein the information words are differential-encoded and which further comprises:

means for differential-decoding the differential-encoded information words.

17. A device according to claim 10, wherein the predetermined reversible code word is the code word assigned according to a code table to an information word on a boundary of the region of information words.

18. A device according to claim 16, wherein the means for ascertaining is arranged to form the sum of the information word on a boundary of the region and of the additional value, so as to obtain an information word located outside said region.

19. A method for entropy encoding of information words, comprising:

assigning a reversible code word from a group of reversible code words to an information word which is located within a region of information words, the group of reversible code words being designed such that, for each information word within the region, there is provided one specific reversible code word each;

producing a predetermined reversible code word for an information word located outside said region of information words;

producing an additional value for the information word which is located outside said region of information words;

producing a data stream of reversible code words comprising only reversible code words for information words within said region and comprising predetermined reversible code words for information words outside said region; and coding the additional value by assigning a non-reversible variable length code word from a group of non-reversible variable length code words to the additional value, with an escape region being produced which is separated from the data stream of reversible code words and consists of non-reversible variable length code words, there being always assigned one code word of the escape region to one of the predetermined code words of the data stream each.

20. A method for decoding of information words that are entropy-encoded using reversible code words, said information words being present in the form of a data stream and an escape region, the data stream comprising only reversible code words for information words within a region of information words and the escape region comprising non-reversible code words for additional values representing information words outside the region of information words, there being always assigned one code word of the escape region to one predetermined code word of the data stream each, said method comprising the following steps:

detecting a reversible code word from the data stream;

assigning a specific information word to the code word detected from the data stream, on the basis of a code table;

detecting a predetermined reversible code word in the data stream;

ascertaining a non-reversible variable length code word in the escape region, which is assigned to the predetermined reversible code word detected from the data stream;

assigning an additional value to the non-reversible variable length code word on the basis of an escape table for the non-reversible variable length code words; and ascertaining an information word outside of the region of information words on the basis of the additional value.

* * * * *